US009756736B2

(12) United States Patent
Honda et al.

(10) Patent No.: US 9,756,736 B2
(45) Date of Patent: Sep. 5, 2017

(54) PROCESS FOR PRODUCING A WIRING BOARD

(71) Applicant: KIYOKAWA PLATING INDUSTRY CO., LTD., Fukui-shi, Fukui (JP)

(72) Inventors: Shojiro Honda, Fukui (JP); Yosuke Haruki, Fukui (JP); Hajime Kiyokawa, Fukui (JP)

(73) Assignee: KIYOKAWA PLATING INDUSTRY CO., LTD, Fukui-shi (JP)

( * ) Notice: Subject to any disclaimer, the term of this patent is extended or adjusted under 35 U.S.C. 154(b) by 9 days.

(21) Appl. No.: 14/957,861

(22) Filed: Dec. 3, 2015

(65) Prior Publication Data

US 2016/0353584 A1 Dec. 1, 2016

Related U.S. Application Data

(63) Continuation of application No. PCT/JP2015/070125, filed on Jul. 14, 2015.

(30) Foreign Application Priority Data

May 31, 2015 (JP) .................. 2015-110988
May 31, 2015 (JP) .................. 2015-110989

(51) Int. Cl.
*C25D 5/48* (2006.01)
*C25D 5/54* (2006.01)
(Continued)

(52) U.S. Cl.
CPC ............. *H05K 3/423* (2013.01); *C25D 5/022* (2013.01); *C25D 5/48* (2013.01); *C25D 5/54* (2013.01); *C25D 7/123* (2013.01); *C25D 3/38* (2013.01)

(58) Field of Classification Search
CPC . C25D 5/022; C25D 5/48; C25D 5/54; C25D 7/123
See application file for complete search history.

(56) References Cited

U.S. PATENT DOCUMENTS

2004/0173909 A1   9/2004  Sinha et al.
2006/0201201 A1   9/2006  Fushie et al.
(Continued)

FOREIGN PATENT DOCUMENTS

JP   2003-23251 A    1/2003
JP   2003-309214 A   10/2003
(Continued)

OTHER PUBLICATIONS

International Search Report dated Oct. 6, 2015, issued in counterpart International Application No. PCT/JP2015/070125 (3 pages).

*Primary Examiner* — Stefanie S Wittenberg
(74) *Attorney, Agent, or Firm* — Westerman, Hattori, Daniels & Adrian, LLP

(57) ABSTRACT

A process for efficiently producing a wiring board in which an insulating substrate 1 having a through hole 2 is used, which includes forming a seed layer 3 on one surface of the insulating substrate 1, covering the surface of the insulating substrate 1 on which the seed layer 3 is formed with a masking film 4, arranging the insulating substrate 1 and a positive electrode 5 so that the surface of the insulating substrate 1 opposite to the surface of the insulating substrate 1 on which the seed layer 3 of the insulating substrate 1 is formed is faced to the positive electrode 5, carrying out electroplating to form a metal layer 8 in the through hole 2, and then removing the masking film 4.

3 Claims, 3 Drawing Sheets

(51) Int. Cl.
*H05K 3/42* (2006.01)
*C25D 7/12* (2006.01)
*C25D 5/02* (2006.01)
*C25D 3/38* (2006.01)

(56) References Cited

U.S. PATENT DOCUMENTS

| | | | |
|---|---|---|---|
| 2006/0201818 A1* | 9/2006 | Fushie | H05K 3/0023 205/183 |
| 2008/0092378 A1 | 4/2008 | Chujo et al. | |
| 2012/0228778 A1* | 9/2012 | Kosenko | H01L 21/76898 257/774 |
| 2013/0313122 A1 | 11/2013 | Wei et al. | |

FOREIGN PATENT DOCUMENTS

| | | | |
|---|---|---|---|
| JP | 2007-95743 A | 4/2007 |
| JP | 2010-21327 A | 1/2010 |
| JP | 5558614 B1 | 7/2014 |
| WO | 2005/027605 A1 | 3/2005 |
| WO | 2006/057175 A1 | 6/2006 |

* cited by examiner

[Fig. 1]
(a) 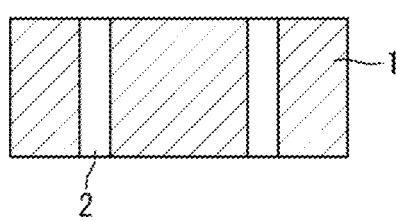
(b) 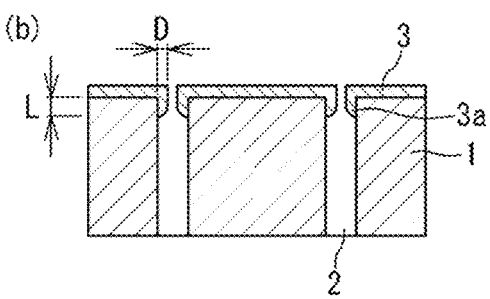
(c) 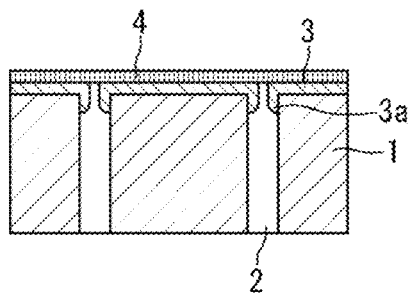
(d) 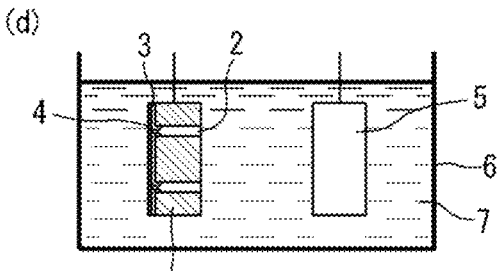
(e) 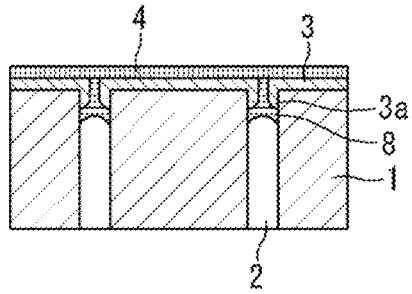
(f) 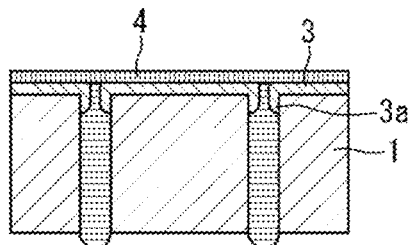
(g) 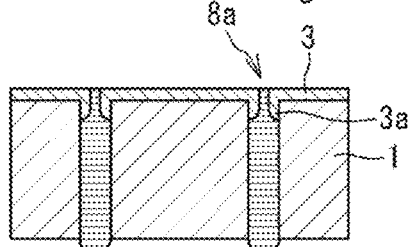
(h) 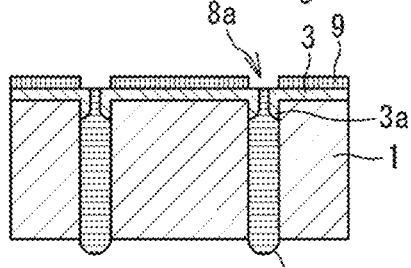
(i) 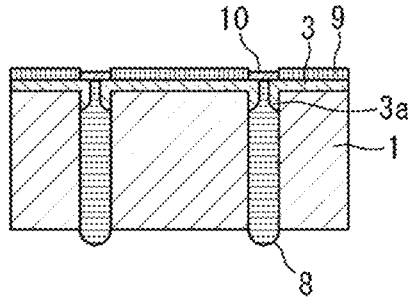
(j) 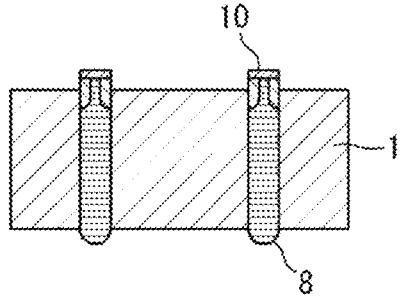

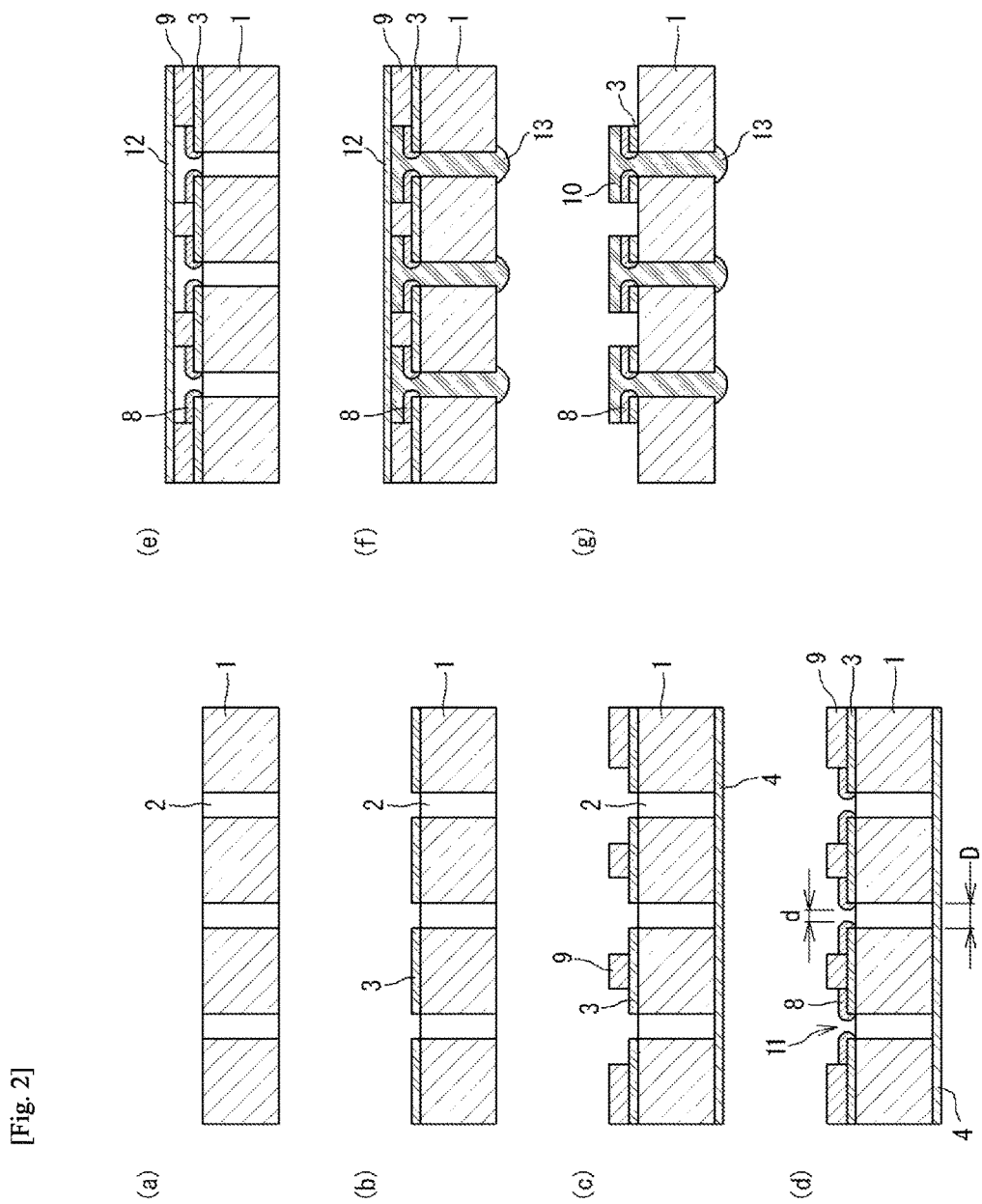

[Fig. 3]
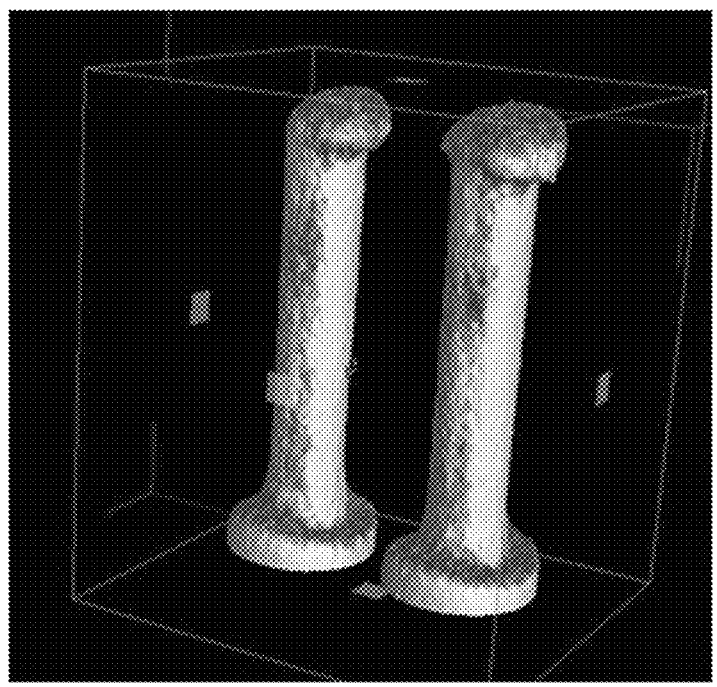

PROCESS FOR PRODUCING A WIRING BOARD

TECHNICAL FIELD

The present invention relates to a process for producing a wiring board. More specifically, the present invention relates to a process for producing a wiring board which can be suitably used, for example, as a wiring board used for mounting a semiconductor chip and the like.

BACKGROUND ART

When a wiring board is produced, there has been generally employed a process which includes using an insulating substrate such as a resin plate having a through hole, dipping the insulating substrate in a plating solution, and then carrying out electroplating to fill the through hole with a metal (see, for example, Patent Literature 1 and Patent Literature 2). However, when the above-mentioned process is employed, there is a possibility to generate an air gap which is a so-called void in a metal layer which is filled in the through hole of the insulating substrate by electroplating. Therefore, the process has a defect such that reliability of the wiring board is remarkably lowered.

As a process for producing a wiring board, which hardly generates a void in a metal layer filled in a through hole, there has been proposed a process for producing a wiring board, which includes using an insulating substrate having a through hole, forming a seed layer on one surface of the insulating substrate, covering the surface of the insulating substrate opposite to the surface on which the seed layer is formed with a masking film, arranging the insulating substrate and a positive electrode so that the surface of the insulating substrate on which the seed layer is formed is faced to the positive electrode, carrying out electroplating to close the through hole existing on the surface on which the seed layer is formed with a metal layer, thereafter removing the masking film from the insulating substrate, arranging the insulating substrate and a positive electrode so that the surface of the insulating substrate from which the masking film has been removed is faced to a positive electrode, carrying out electroplating to form a metal layer in the through hole (see, for example, Patent Literature 3).

According to the above-mentioned process for producing a wiring board, a wiring board having high reliability can be produced because a void is hardly generated in a metal layer filled in the through hole.

However, in recent years, it has been desired to develop a process for producing a wiring board, in which not only a void is hardly generated in a metal layer filled in a through hole, but also a wiring board can be efficiently produced without a process for closing a through hole existing on the surface of the wiring board on which a seed layer is formed with a metal layer.

Furthermore, in recent years, it has been desired to develop a process for producing a wiring board, which enables to shorten a period of time necessary for plating, and enables to reduce the amount of a metal by reducing the thickness of a metal layer formed by electroplating on the surface of a seed layer, and which also enables to make an electrode smooth.

PRIOR ART LITERATURES

Patent Literatures

Patent Literature 1: Japanese Unexamined Patent Publication No. 2003-023251

Patent Literature 2: Japanese Unexamined Patent Publication No. 2003-309214

Patent Literature 3: Japanese Patent No. 5558614

SUMMARY OF THE INVENTION

Problems to be Solved by the Invention

An object of the present invention is to provide a process for producing a wiring board, which hardly generates a void in a metal layer filled in a through hole, and which enables to efficiently produce a wiring board without a process for closing a through hole existing on the surface on which a seed layer is formed with a metal layer.

In addition, an object of the preset invention to provide a process for producing a wiring board, which hardly generates a void in a metal layer formed in a through hole, which enables to shorten a period of time necessary for plating, and enables to reduce the amount of a formed metal layer by reducing the thickness of a metal layer which is formed by electroplating on the surface of a seed layer, and which also enables to make an electrode smooth.

Means for Solving the Problems

The first aspect of the present invention (hereinafter referred to as the first invention) is a process for producing a wiring board in which an insulating substrate having a through hole is used, which includes forming a seed layer on one surface of an insulating substrate, covering the surface of the insulating substrate on which the seed layer is formed with a masking film, arranging the insulating substrate and a positive electrode so that the surface of the insulating substrate which is opposite to the surface of the insulating substrate on which the seed layer is formed is faced to the positive electrode, carrying out electroplating to form a metal layer in the through hole, and thereafter removing the masking film from the insulating substrate.

The second aspect of the present invention (hereinafter referred to as the second invention) is a process for producing a wiring board in which an insulating substrate having a through hole is used, which includes forming a seed layer on one surface of an insulating substrate; forming a resist layer on an area of the seed layer where an electrode is not formed, and covering the surface of the insulating substrate opposite to the surface of the insulating substrate on which the seed layer is formed with a masking film; carrying out electroplating on the surface of the insulating substrate on which the seed layer is formed to form a metal layer in the through hole so that the diameter of an opening of the through hole in which the metal layer is formed is 10 to 50% of the diameter of the opening of the through hole before formation of the metal layer; covering the surface of the insulating substrate on which the seed layer is formed with a masking film, and removing the masking film which covers the surface of the insulating substrate opposite to the surface of the insulating substrate on which the seed layer is formed; carrying out electroplating from the surface of the insulating substrate opposite to the surface of the insulating substrate on which the seed layer is formed to form a metal layer in the through hole, and thereby an electrode is formed; and removing the masking film formed on the seed layer, the resist layer and the seed layer from the insulating substrate.

Effects of the Invention

According to the process for producing a wiring board of the first invention, there can be exhibited excellent effects such that a void is hardly generated in a metal layer filled in a through hole, and that a wiring board can be efficiently produced without a process for closing a through hole existing on the surface of the insulating substrate on which a seed layer is formed with a metal layer.

According to the process for producing a wiring board of the second invention, there can be exhibited excellent effects such that a void is hardly generated in a metal layer filled in a through hole, that the period of time necessary for plating can be shortened, and the amount of the formed metal can be reduced by thinning the metal layer formed on the surface of a seed layer by electroplating, and that a wiring board having a smooth electrode can be produced.

BRIEF DESCRIPTION OF DRAWINGS

FIG. 1 is a schematic drawing which shows one embodiment of a process for producing a wiring board according to the first invention.

FIG. 2 is a schematic drawing which shows one embodiment of a process for producing a wiring board according to the second invention.

FIG. 3 is a photograph in place of a drawing, which shows an image of a wiring board obtained in Example II-1 of the second invention, which was photographed by means of a micro-focus X-ray inspection apparatus.

MODES FOR CARRYING OUT THE INVENTION

As described above, the process for producing a wiring board of the first invention is a process for producing a wiring board, in which an insulating substrate having a through hole is used, which includes forming a seed layer on one surface of an insulating substrate, covering the surface of the insulating substrate on which the seed layer is formed with a masking film, arranging the insulating substrate and a positive electrode so that the surface of the insulating substrate opposite to the surface of the insulating substrate on which the seed layer is formed is faced to the positive electrode, carrying out electroplating to form a metal layer in the through hole, and thereafter removing the masking film from the insulating substrate.

According to the first invention, a void is hardly generated in a metal layer filled in a through hole, and a wiring board can be efficiently produced without a process for closing a through hole existing on the surface of the insulating substrate on which a seed layer is formed with a metal layer.

As described above, the process for producing a wiring board according to the second invention is a process for producing a wiring board, in which an insulating substrate having a through hole is used, which includes forming a seed layer on one surface of an insulating substrate; forming a resist layer on an area of the seed layer where an electrode is not formed, and covering the surface of the insulating substrate opposite to the surface of the insulating substrate on which the seed layer is formed with a masking film; carrying out electroplating on the surface of the insulating substrate on which the seed layer is formed to form a metal layer in the through hole so that the diameter of an opening of the through hole in which the metal layer is formed is 10 to 50% of the diameter of the opening of the through hole before formation of the metal layer; covering the surface of the insulating substrate on which the seed layer is formed with a masking film, and removing the masking film which covers the surface of the insulating substrate opposite to the surface of the insulating substrate on which the seed layer is formed; carrying out electroplating from the surface of the insulating substrate opposite to the surface of the insulating substrate on which the seed layer is formed to form a metal layer in the through hole, and thereby an electrode is formed; and removing the masking film formed on the seed layer, the resist layer and the seed layer from the insulating substrate.

According to the second invention, since the above-mentioned process is employed, a void is hardly generated in a metal layer filled in a through hole; the period of time necessary for plating can be shortened; and the amount of the formed metal can be reduced by thinning the metal layer formed on the surface of a seed layer by electroplating; and a wiring board having a smooth electrode can be produced.

It is preferred that the insulating substrate which is used in the first invention and the second invention has high insulating property, and that the insulating substrate is excellent in mechanical strength. Preferred insulating substrate includes, for example, a silicon substrate, a glass substrate, a resin substrate made of a resin such as an epoxy resin, a fluorine resin, a phenol resin, a polyester, a polyimide or a cycloolefin polymer, a substrate made of a fiber reinforced resin such as a glass fiber reinforced epoxy resin or an aramid fiber reinforced epoxy resin, and the like. The present invention is not limited only to those exemplified ones. Among these insulating substrates, the silicon substrate and the glass substrate are preferred because the silicon substrate and the glass substrate are excellent in handling and insulating property.

The thickness of the insulating substrate cannot be absolutely determined, because the thickness differs depending on the use of the wiring board and the like. Therefore, it is preferred that the thickness of the insulating substrate is appropriately determined in accordance with the use of the wiring board and the like. The thickness of the insulating substrate is usually 30 to 800 μm or so. Also, the size of the insulating substrate cannot be absolutely determined, because the size of the insulating substrate differs depending on the use of the wiring board and the like, as well as the thickness of the insulating substrate. Therefore, it is preferred that the size of the insulating substrate is appropriately determined in accordance with the use of the wiring board and the like.

A through hole is formed in the insulating substrate. The through hole can be formed in the insulating substrate, for example, by a dry etching method using plasma, a laser processing method using a laser such as an Excimer laser or a UV-YAG laser, and the like. The hole diameter of the through hole formed in the insulating substrate cannot be absolutely determined, because the hole diameter differs depending on the use of the wiring board and the like. Therefore, it is preferred that the hole diameter is appropriately determined in accordance with the use of the wiring board, and the like. The hole diameter of the through hole is preferably 1 to 200 μm, more preferably 5 to 200 μm, and furthermore preferably 10 to 100 μm from the viewpoint of inhibition of generation of a void in a metal layer formed in a through hole.

After a through hole is formed in the insulating substrate, in order to avoid that swarf, which is generated in forming a through hole by piercing the insulating substrate, remains in the through hole, it is preferred that the swarf is removed from the through hole as occasion demands.

At first, the process for producing a wiring board of the first invention will be described with reference to drawings. FIG. 1 is a schematic drawing which shows one embodiment of a process for producing a wiring board according to the first invention.

In the first invention, as shown in FIG. 1(a), an insulating substrate 1 having a through hole 2 is used.

Next, as shown in FIG. 1(b), a seed layer 3 is formed on one surface of the insulating substrate 1. The seed layer 3 is formed in order to improve adhesion of the insulating substrate 1 and a metal layer (not shown in the figure) which is described below. As the seed layer 3, a metal is usually used.

When a glass substrate or a resin substrate is used as the insulating substrate 1, it is preferred that the metal used in the seed layer 3 is the same kind of a metal which is used in the metal layer from the viewpoint of improvement in adhesion of the glass substrate or the resin substrate, which is used as the insulating substrate 1 and the metal layer which is formed on the seed layer 3.

When a silicon substrate is used as the insulating substrate 1, from the viewpoint of improvement in adhesion of the silicon substrate which is used as the insulating substrate 1 and a metal layer, and the viewpoint of inhibition of lowering in insulation of the silicon substrate due to the diffusion of a metal such as copper which is used in the metal layer in the silicon substrate, it is preferred that the seed layer 3 is, for example, a seed layer in which a titanium layer and a copper layer are sequentially laminated from the silicon substrate side, a seed layer in which a titanium layer and a chromium layer are sequentially laminated from the silicon substrate side, a seed layer made of cobalt-tungsten-phosphorus (Co—W—P), a seed layer made of nickel-tungsten-phosphorus (Ni—W—P), a seed layer made of palladium-cobalt-phosphorus (Pd—Co—P) or the like.

The seed layer 3 can be formed, for example, by a sputtering method, a chemical vapor deposition (CVD) method, a physical vapor deposition (PVD) method, a plating process, and the like.

The thickness of the seed layer 3 formed on one surface of the insulating substrate 1 is not particularly limited, and it is preferred that the thickness is 100 to 500 nm or so from the viewpoint of improvement in adhesion of the insulating substrate 1 and the metal layer.

When the seed layer 3 is formed on one surface of the insulating substrate 1, as shown in FIG. 1(b), a protrusion 3a of the seed layer 3 is usually formed on the inner surface of the through hole 2 of the insulating substrate 1. Since the protrusion 3a of the seed layer 3 formed on the inner surface of the through hole 2 of the insulating substrate 1 becomes a growth point when a metal layer (not shown in the figure) is formed in the through hole 2 as described below, and enables to grow up the metal layer, a metal layer in which no void is generated can be formed. The length L of the protrusion 3a is preferably 10 nm or more, more preferably 20 nm or more, furthermore preferably 30 nm or more, from the viewpoint of efficient growth of the metal layer, and preferably 50 μm or less, more preferably 40 μm or less, furthermore preferably 30 μm or less, from the viewpoint of the formation of a metal layer in which no void is generated. In addition, the thickness D of the protrusion 3a is 3 nm or more, more preferably 5 nm or more, furthermore preferably 10 nm or more, from the viewpoint of efficient growth of the metal layer, and preferably 500 μm or less, more preferably 400 μm or less, furthermore preferably 300 μm or less, from the viewpoint of formation of a metal layer in which no void is generated.

When it is avoided that a part of the seed layer 3 is not formed on the inner surface of the through hole 2 of the insulating substrate 1, a masking member for preventing the formation of the seed layer 3, such as a pin (not shown in the figure) can be inserted to the through hole 2.

Next, as shown in FIG. 1(c), the surface of the insulating substrate 1 on which the seed layer 3 is formed is covered with a masking film 4.

In the first invention, as shown in FIG. 1(c), there is one of great characteristics in that the surface of the insulating substrate 1 on which the seed layer 3 is formed is covered with the masking film 4. Since a process for covering the surface of the insulating substrate 1 on which the seed layer 3 is formed with the masking film 4 is employed in the first invention, there is not necessitated a process for closing the through hole 2 of the insulating substrate 1 by electroplating prior to filling the through hole 2 of the insulating substrate 1 with a metal layer, which has been conventionally employed, and moreover, there is not necessitated a process for closing the through hole 2 of the insulating substrate 1 by electroplating. Therefore, a complicated post process such as a process for polishing the surface of the closed through hole 2 or a process for cleaning is not necessitated. Accordingly, the first invention has an advantage in that the number of processes necessary for producing a wiring board can be significantly reduced.

The masking film 4 includes, for example, a resin film made of a resin such as a polyester such as polyethylene terephthalate or polybutylene terephthalate; a polyolefin such as polyethylene or polypropylene; a polyamide such as nylon 11, nylon 12, nylon 6 or nylon 66; an acrylic resin such as polymethyl methacrylate; polyvinyl chloride; or polyvinylidene chloride; a film made of an elastomer such as polyurethane elastomer; a rubber sheet made of a natural rubber or a synthetic rubber such as styrene-butadiene rubber; a metal foil such as an aluminum foil; and the like, and the first invention is not limited only to those exemplified ones. The thickness of the masking film is not particularly limited, and it is preferred that the thickness is usually 10 to 200 μm or so.

A process for covering the surface of the insulating substrate 1 on which the seed layer 3 is formed with the masking film 4 includes, for example, a process which includes using a masking film made of a thermoplastic resin as the masking film 4, placing the masking film on the surface of the insulating substrate 1 on which the seed layer 3 is formed, and heating the masking film for temporarily adhering the masking film to the insulating substrate 1, a process which includes using a masking film having an adhesive layer as the masking film 4, superimposing the surface of the masking film on which the adhesive layer is formed on the surface of the insulating substrate 1 on which the seed layer 3 is formed, to temporarily adhere the masking film to the insulating substrate 1, and the like, and the first invention is not limited only to those exemplified ones.

Next, as shown in FIG. 1(d), the insulating substrate 1 and a positive electrode 5 are arranged so that the surface of the insulating substrate 1 opposite to the surface of the insulating substrate 1 on which the seed layer 3 is formed is faced to the positive electrode 5, and carrying out electroplating, to form a metal layer 8 in the through hole 2. Since the above-mentioned process is employed in the first invention, there is not necessitated a process for closing the through hole 2 of the insulating substrate 1 by electroplating prior to filling the through hole 2 of the insulating substrate 1 with a metal layer, which has conventionally employed, and moreover there is not necessitated a process for closing the through hole 2 of the insulating substrate 1 by electroplating. Therefore, there is no necessity to carry out complicated post processes such as polishing and cleaning of the surface of the insulating substrate 1 on which the through hole 2 is closed. Accordingly, there is an advantage in the process that the number of processes necessary for producing a wiring board can be significantly reduced. In addition, since the above-mentioned process is employed in the first invention, the growth speed of the metal layer 8 grown up in each of through holes 2 can be controlled so as to be approximately constant, and the height of the metal layer (not shown in the figure) protruded from the through hole 2 on the surface of the insulating substrate 1 on which the seed layer 3 is formed can be controlled by the masking film 4. Therefore, there is an advantage in the process that the height of the metal layer protruded from the through hole 2 on the surface of the insulating substrate 1 on which the seed layer 3 is formed can be controlled so as to be approximately constant.

In accordance with the growth of the metal layer 8 in the through hole 2 by carrying out electroplating, the metal layer 8 is formed in the through hole 2 as shown in FIG. 1(*e*) and FIG. 1(*f*). At that time, the metal layer 8 grows up from the seed layer 3, preferably the protrusion 3*a* of the seed layer 3 as a nucleus. Therefore, a metal layer 8 in which no void is generated can be formed in the through hole 2.

When the insulating substrate 1 and the positive electrode 5 are arranged so that the surface of the insulating substrate 1 opposite to the surface of the insulating substrate 1 on which the seed layer 3 is formed is faced to the positive electrode 5, and electroplating is carried out, an electrolysis vessel 6 can be used as shown in FIG. 1(*d*).

The insulating substrate 1 and the positive electrode 5 are arranged in an electrolysis vessel 6 so that the surface of the insulating substrate 1 opposite to the surface of the insulating substrate 1 on which the seed layer 3 covered with the masking film 4 is formed is faced to the positive electrode 5. The electrolysis vessel 6 is charged with a plating solution 7 so that the insulating substrate 1 and the positive electrode 5 are dipped in the plating solution 7, and then electroplating can be carried out. At that time, the seed layer 3 which is exposed on the surface of the through hole 2 which is opposite to the surface of the insulating substrate 1 on which the seed layer 3 is formed acts as a negative electrode. Incidentally, in the present invention, electrolytic plating can be carried out after the electrolysis vessel 6 is charged with the plating solution 7, and the insulating substrate 1 and the positive electrode 5 are dipped in the plating solution 7 so that the surface of the insulating substrate 1 which is opposite to the surface of the insulating substrate 1 on which the seed layer 3 is formed is faced to the positive electrode 5.

In addition, according to the embodiment shown in FIG. 1(*d*), the insulating substrate 1 and the positive electrode 5 are arranged perpendicularly (vertically). However, the insulating substrate 1 and the positive electrode 5 can be arranged horizontally.

The distance between the insulating substrate 1 and the positive electrode 5 is not particularly limited. It is preferred that the distance is 5 to 50 mm or so from the viewpoint of efficient formation of the metal layer 8 starting from the seed layer 3 exposed on the surface of the through hole 2 which is opposite to the surface of the insulating substrate 1 on which the seed layer 3 is formed.

The plating solution 7 can be appropriately selected in accordance with the kind of a metal which is used in a metal layer (not shown in the figure) formed in the through hole 2 of the insulating substrate 1. The metal which is used in the metal layer includes, for example, gold, silver, copper, platinum, aluminum, tin, rhodium, nickel, chromium, cobalt, palladium, tungsten, an alloy made of these metals and the like, and the first invention is not limited only to those exemplified ones. In addition, as a metal which is used in the positive electrode 5, there can be used a metal corresponding to the kind of the metal which is used in the metal layer formed in the through hole 2 of the insulating substrate 1. The metal which is used in the positive electrode 5 is the same as the metal which is used in the metal layer. The metal includes, for example, gold, silver, copper, platinum, aluminum, tin, rhodium, nickel, chromium, cobalt, palladium, tungsten, an alloy made of these metals and the like, and the first invention is not limited only to those exemplified ones.

The kind of the plating solution 7 can be selectively used in accordance with the kind of a metal which is used in the metal layer formed in the through hole 2 of the insulating substrate 1. For example, when the metal which is used in the metal layer formed in the through hole 2 of the insulating substrate 1 is copper, there can be used a copper sulfate-containing plating solution which includes copper sulfate and sulfuric acid, and as occasion demands, chloride ion, a plating inhibitor, a plating promoter and the like as the plating solution 7.

When electroplating is carried out on the insulating substrate 1, the current density is not particularly limited. The current density is preferably 0.5 to 30 $A/dm^2$, more preferably 0.5 to 5 $A/dm^2$ from the viewpoint of efficient formation of a close packed metal layer 8 in the through hole 2 of the insulating substrate 1. In addition, when electroplating is carried out, the liquid temperature of the plating solution 7 is not particularly limited. The liquid temperature is preferably 5 to 80° C., more preferably room temperature.

After the metal layer 8 is formed as mentioned above in the through hole 2 of the insulating substrate 1 as shown in FIG. 1(*f*), the masking film 4 is removed from the insulating substrate 1, to give the insulating substrate 1 having the metal layer 8 which is formed and filled in the through hole 2, and the seed layer 3 on its surface, as shown in FIG. 1(*g*).

According to the process for producing a wiring board of the first invention, since the seed layer 3 existing in the through hole 2 of the insulating substrate 1 acts as a nucleus, and the metal layer 8 successively grows up in the through hole 2 from the seed layer 3, the metal layer 8 in which no void is generated can be formed in the through hole 2. Therefore, reliability of an obtained wiring board can be remarkably enhanced.

In addition, as shown in FIG. 1(*g*), since the surface 8*a* of the metal layer 8 filled in the through hole 2, which is formed on the seed layer 3 is smoothed by the masking film 4, for example, an electrode (not shown in the figure) can be formed on the surface 8*a* of the metal layer 8 as it is without a post process for smoothing the surface 8*a* of the metal layer 8.

Subsequently, when an electrode is formed on the surface 8*a* of the metal layer 8 of the insulating substrate 1, as shown in FIG. 1(*h*), a resist layer 9 having a pattern for forming an electrode can be placed on the surface 8*a* of the metal layer 8 of the insulating substrate 1.

It is preferred that a dry film resist is usually used as the resist layer 9 from the viewpoint of improvement in workability. The dry film resist includes a negative type dry film resist and a positive type dry film resist. In the first invention, any of those dry film resists can be used. The negative type dry film resist includes, for example, a photo-curable dry film resist, a thermosetting dry film resist and the like, and the first invention is not limited only to those exemplified ones. It is preferred that the dry film resist is previously patterned in accordance with the pattern of the insulating substrate 1.

It is preferred that the thickness of the resist layer 9 is appropriately determined in accordance with the height of an electrode 10 as shown in FIG. 1(*i*). The thickness of the resist layer 9 is usually 10 to 200 μm or so.

The electrode 10 can be formed, for example, by electroplating. The electroplating can be carried out by arranging the insulating substrate 1 and a positive electrode (not shown in the figure) in an electrolysis vessel (not shown in the figure) so that the surface of the insulating substrate 1 on which the seed layer 3 is formed is faced to the positive electrode, charging the electrolysis vessel with a plating solution so that the insulating substrate 1 and the positive electrode are dipped in the plating solution, and thereafter carrying out electrolytic plating. At that time, the metal layer 8 filled in the through hole 2 of the insulating substrate 1 acts as a negative electrode. Incidentally, in the present invention, electrolytic plating also can be carried out by charging a plating vessel with a plating solution, dipping the insulating substrate 1 and the positive electrode in the plating solution so that the surface of the insulating substrate 1 on which the seed layer 3 is formed is faced to the positive electrode, and thereafter carrying out electrolytic plating.

The distance between the insulating substrate 1 and the positive electrode is not particularly limited. It is preferred that that the distance is 5 to 50 mm or so from the viewpoint of efficient formation of the metal layer 8 starting from the metal layer 8 exposed on the surface of the insulating substrate 1 on which the seed layer 3 is formed.

The plating solution can be appropriately selected in accordance with the kind of a metal which is used in the electrode 10. The metal used in the electrode 10 includes, for example, gold, silver, copper, platinum, aluminum, tin, rhodium, nickel, chromium, cobalt, palladium, tungsten, an alloy made of these metals and the like, and the first invention is not limited only to those exemplified ones. In addition, as a metal which is used in the positive electrode, there can be used a metal corresponding to the kind of the metal which is used in the electrode 10. The metal which is used in the positive electrode is the same as the metal which is used in the electrode 10. The metal includes, for example, gold, silver, copper, platinum, aluminum, tin, rhodium, nickel, chromium, cobalt, palladium, tungsten, an alloy made of these metals and the like, and the first invention is not limited only to those exemplified ones.

The kind of the plating solution can be selectively used in accordance with the kind of a metal which is used in the electrode 10. For example, when the metal which is used in the electrode 10 is copper, there can be used a copper sulfate-containing plating solution which includes copper sulfate and sulfuric acid, and as occasion demands, chloride ion, a plating inhibitor, a plating promoter and the like as the plating solution 7.

When electroplating is carried out on the insulating substrate 1, the current density is not particularly limited. The current density is preferably 0.5 to 30 A/dm$^2$, more preferably 0.5 to 5 A/dm$^2$ from the viewpoint of efficient formation of a dense electrode 10. In addition, when electroplating is carried out, the liquid temperature of the plating solution 7 is not particularly limited. The liquid temperature is usually preferably 5 to 80° C., more preferably room temperature.

The electrode 10 is thus formed on the surface 8*a* of the metal layer 8 of the insulating substrate 1. The thickness of the electrode 10 cannot be absolutely determined because the thickness differs depending on the use of the wiring board and the like, and the thickness is usually 3 to 80 μm or so.

Next, the seed layer 3 and the resist layer 9 formed on the seed layer 3 as shown in FIG. 1(*i*) are removed from the insulating substrate 1, to give a wiring board as shown in FIG. 1(*j*). Incidentally, the resist layer 9 can be easily removed from the insulating substrate 1, for example, by exfoliating. The seed layer 3 can be easily removed from the insulating substrate 1, for example, by chemical reaction with a wet etching technique in which an etchant (etching solution) is used.

As described above, according to the process for producing a wiring board of the first invention, not only a void is hardly generated in the metal layer filled in the through hole, but also the wiring board can be efficiently produced without a process for closing the through hole on the surface of the insulating substrate 1 on which the seed layer is formed with a metal layer.

Accordingly, the wiring board obtained by the process for producing a wiring board of the first invention is excellent in reliability since a void is hardly generated in the metal layer filled in the through hole. Therefore, it is expected that the wiring board is used, for example, as a wiring board for mounting a semiconductor chip, and the like.

Next, a process for producing a wiring board of the second invention will be described below with reference to drawings. FIG. 2 is a schematic drawing which shows one embodiment of a process for producing a wiring board according to the second invention.

In the second invention, as shown in FIG. 2(*a*), an insulating substrate 1 having a through hole 2 is used.

Next, as shown in FIG. 2(*b*), a seed layer 3 is formed on one surface of the insulating substrate 1. The seed layer 3 is formed in order to improve the adhesion of the insulating substrate 1 and a metal which is used in electroplating. In the seed layer 3, a metal is usually used. When a glass substrate or a resin substrate is used as the insulating substrate 1, it is preferred that the metal which is used in the seed layer 3 is the same kind as the metal which is used in electroplating from the viewpoint of improvement in adhesion of the glass substrate or the resin substrate which is used as the insulating substrate 1 and the metal layer (not shown in the figure) which is formed on the seed layer 3.

When a silicon substrate is used as the insulating substrate 1, from the viewpoint of improvement in adhesion of the silicon substrate which is used as the insulating substrate 1 and a metal which is used in electroplating, and the viewpoint of inhibition of lowering in insulation of the silicon substrate due to the diffusion of a metal such as copper which is used in electroplating, it is preferred that the seed layer 3 is, for example, a seed layer in which a titanium layer and a copper layer are sequentially laminated from the silicon substrate side, a seed layer in which a titanium layer and a chromium layer are sequentially laminated from the silicon substrate side, a seed layer made of cobalt-tungsten-phosphorus (Co—W—P), a seed layer made of nickel-tungsten-phosphorus (Ni—W—P), a seed layer made of palladium-cobalt-phosphorus (Pd—Co—P) or the like.

The seed layer 3 can be formed, for example, by a sputtering method, a chemical vapor deposition (CVD) method, a physical vapor deposition (PVD) method, a plating process, and the like.

The thickness of the seed layer 3 which is formed on one surface of the insulating substrate 1 is not particularly limited, and it is preferred that the thickness is 100 to 500 nm or so from the viewpoint of improvement in adhesion of the insulating substrate 1 and the metal which is used in electroplating.

Incidentally, when the seed layer 3 is formed on one surface of the insulating substrate 1, a part of the seed layer 3 is sometimes formed on the inner surface of the through hole 2 of the insulating substrate 1. In the second invention, a part of the seed layer 3 can be formed on the inner surface of the through hole 2 of the insulating substrate 1, or the seed layer 3 can be formed only on the surface of the insulating substrate 1, so long as an object of the second invention is not hindered. In the case where a part of the seed layer 3 would not be formed on the inner surface of the through hole 2 of the insulating substrate 1, for example, a masking member such as a pin (not shown in the figure) for preventing the formation of a seed layer 3 on the inner surface can be inserted to the through hole 2.

Subsequently, as shown in FIG. 2(c), a resist layer 9 is formed on an area of the seed layer where an electrode is not formed (not shown in the figure) on the seed layer 3 which is formed in the above, and the surface of the insulating substrate 1 which is opposite to the surface of the insulating substrate 1 on which the seed layer 3 is formed is covered with a masking film 4.

The order of a process for forming the resist layer 9 on an area of the seed layer 3 where an electrode is not formed and a process for covering the surface of the insulating substrate 1 which is opposite to the surface of the insulating substrate 1 on which the seed layer 3 is formed with the masking film 4 is not particularly limited, and any of these operations can be carried out earlier.

Incidentally, the area of the seed layer 3 where an electrode is not formed means an area where the electrode 10 is not formed on the seed layer 3 as shown in FIG. 2(g). The electrode 10 is usually formed on the through hole 2.

It is preferred that a dry film resist is usually used as the resist layer 9 from the viewpoint of improvement in workability. The dry film resist includes a negative type dry film resist and a positive type dry film resist. In the second invention, any of those dry film resists can be used. The negative type dry film resist includes, for example, a photocurable dry film resist, a thermosetting dry film resist and the like, and the second invention is not limited only to those exemplified ones. It is preferred that the dry film resist is previously patterned in accordance with the pattern of the insulating substrate 1.

It is preferred that the thickness of the resist layer 9 is appropriately determined in accordance with the height of the electrode 10 as shown in FIG. 2(g). The thickness of the resist layer 9 is usually 10 to 200 μm or so.

The surface of the insulating substrate 1 which is opposite to the surface of the insulating substrate 1 on which the seed layer 3 is formed is covered with a masking film 4. The masking film 4 includes, for example, a resin film made of a resin such as a polyester such as polyethylene terephthalate or polybutylene terephthalate; a polyolefin such as polyethylene or polypropylene; a polyamide such as nylon 11, nylon 12, nylon 6 or nylon 66; an acrylic resin such as polymethyl methacrylate; polyvinyl chloride; or polyvinylidene chloride; a film made of an elastomer such as polyurethane elastomer; a rubber sheet made of a natural rubber or a synthetic rubber such as styrene-butadiene rubber; a metal foil such as an aluminum foil; and the like, and the second invention is not limited only to those exemplified ones. The thickness of the masking film is not particularly limited, and it is preferred that the thickness is usually 10 to 200 μm or so.

A process for covering the surface of the insulating substrate 1 on which the seed layer 3 is formed with the masking film 4 includes, for example, a process which includes using a masking film made of a thermoplastic resin as the masking film 4, placing the masking film on the surface of the insulating substrate 1 which is opposite to the surface of the insulating substrate 1 on which the seed layer 3 is formed, and heating the masking film for temporarily adhering the masking film to the insulating substrate 1, a process which includes using a masking film having an adhesive layer as the masking film 4, superimposing the surface of the masking film on which the adhesive layer is formed on the surface of the insulating substrate 1 which is opposite to the surface of the insulating substrate 1 on which the seed layer 3 is formed, to temporarily adhere the masking film to the insulating substrate 1, and the like, and the second invention is not limited only to those exemplified ones.

Subsequently, when a metal layer 8 is formed in the through hole 2 by carrying out electroplating on the surface of the insulating substrate 1 on which the seed layer 3 is formed, the metal layer 8 is formed in the through hole 2 so that the diameter of the opening of the through hole 2 in which the metal layer 8 is formed is 10 to 50% of the diameter of the opening of the through hole 2 before the formation of the metal layer 8, as shown in FIG. 2(d).

The metal layer 8 is formed on the seed layer 3. In accordance with the formation of the metal layer 8 on the seed layer 3, the metal layer 8 is formed on the entire surface of the seed layer 3. Therefore, as shown in FIG. 2(d), a through hole 11 having a diameter d which becomes gradually smaller is formed.

In the second invention, the diameter d of the opening of the through hole 11 is controlled so as to be 10 to 50% of the diameter D of the opening of the through hole 2 before the formation of the metal layer 8 (initial stage). In other words, the diameter d of the opening of the through hole 11 in which the metal layer 8 is formed is controlled so that the value determined by the equation: (diameter d/diameter D)×100 becomes 10 to 50%. One of the great features in the second invention resides in that a process for controlling the diameter d of the opening of the through hole 11 to 10 to 50% of the diameter D of the opening of the through hole 2 before the formation of the metal layer 8 is employed. Since the above-mentioned process is employed in the second invention, there are exhibited excellent effects such that a void is hardly generated in the metal layer 13 which is formed in the through hole 2.

The process for carrying out electroplating on the seed layer 3 includes, for example, a process which includes arranging the insulating substrate 1 and a positive electrode (not shown in the figure) so that the surface of the insulating substrate 1 on which the seed layer 3 is formed is faced to the positive electrode, and carrying out electroplating on the seed layer 3, and the like. When electroplating is thus carried out on the seed layer 3, a metal layer 8 precipitates from the seed layer 3 as a starting point, and the diameter d of the opening of the through hole 2 gradually becomes smaller. The metal layer 8 is formed until the diameter d of the opening of the through hole 11 becomes 10 to 50% of the diameter D of the opening of the through hole 2 before the formation of the metal layer 8.

When electroplating is carried out on the seed layer 3 of the insulating substrate 1, an electrolysis vessel (not shown in the figure) can be used. The insulating substrate 1 and a positive electrode (not shown in the figure) are arranged in the electrolysis vessel so that the surface of the insulating substrate 1 on which the seed layer 3 is formed is faced to the positive electrode, and the electrolysis vessel is charged with a plating solution so that the insulating substrate 1 and the positive electrode are dipped in the plating solution. Thereafter, electroplating can be carried out. At that time, the surface of the insulating substrate 1 on which the seed layer 3 is formed acts as a negative electrode. In addition, the electroplating also can be carried out after the electrolysis vessel is charged with a plating solution, and then the insulating substrate 1 and the positive electrode are dipped in the plating solution.

The distance between the insulating substrate 1 and the positive electrode is not particularly limited, and it is preferred that the distance is 5 to 50 mm or so from the viewpoint that electroplating is carried out efficiently on the surface of the insulating substrate 1 on which the seed layer 3 is formed.

The plating solution can be appropriately selectively used in accordance with the kind of a metal layer 8 which is formed in the through hole 2 of the insulating substrate 1. The metal which is used in the metal layer 8 includes, for example, gold, silver, copper, platinum, aluminum, tin, rhodium, nickel, chromium, cobalt, palladium, tungsten, an alloy made of these metals and the like, and the second invention is not limited only to those exemplified ones. In addition, as a metal which is used in the positive electrode, there can be used a metal corresponding to the kind of the metal which is used in the metal layer 8 formed in the through hole 2 of the insulating substrate 1. The metal which is used in the positive electrode is the same as the metal which is formed in the through hole 2 of the insulating substrate 1. The above-mentioned metal includes, for example, gold, silver, copper, platinum, aluminum, tin, rhodium, nickel, chromium, cobalt, palladium, tungsten, an alloy made of these metals and the like, and the second invention is not limited only to those exemplified ones.

The kind of the plating solution can be selectively used in accordance with the kind of a metal which is used in the metal layer 8 formed in the through hole 2 of the insulating substrate 1. For example, when the metal which is used in the metal layer 8 formed in the through hole 2 of the insulating substrate 1 is copper, there can be used a copper sulfate-containing plating solution which includes copper sulfate and sulfuric acid, and as occasion demands, chloride ion, a plating inhibitor, a plating promoter and the like as the plating solution.

When electroplating is carried out on the insulating substrate 1, the current density is not particularly limited. The current density is preferably 0.5 to 10 A/dm$^2$, more preferably 0.5 to 5 A/dm$^2$ from the viewpoint of efficient formation of a close packed metal layer 8 in the through hole 2 of the insulating substrate 1. In addition, when electroplating is carried out, the liquid temperature of the plating solution is not particularly limited. The liquid temperature is usually preferably 5 to 80° C., more preferably 10 to 60° C., furthermore preferably room temperature.

Subsequently, as shown in FIG. 2(e), the surface of the insulating substrate 1 on which the seed layer 3 is formed is covered with a masking film 12, and the masking film 4 which covers the surface of the insulating substrate 1 opposite to the surface of the insulating substrate 1 on which the seed layer 3 is formed is removed from the insulating substrate 1.

The order of carrying out a process for covering the surface of the insulating substrate 1 on which the seed layer 3 is formed with the masking film 12 and a process for removing the masking film 4 which covers the surface of the insulating substrate 1 opposite to the surface of the insulating substrate 1 on which the seed layer 3 is formed is not particularly limited, and any of these operations can be carried out earlier.

The masking film 12 includes, for example, a resin film made of a resin such as a polyester such as polyethylene terephthalate or polybutylene terephthalate; a polyolefin such as polyethylene or polypropylene; a polyamide such as nylon 11, nylon 12, nylon 6 or nylon 66; an acrylic resin such as polymethyl methacrylate; polyvinyl chloride; or polyvinylidene chloride; a film made of an elastomer such as polyurethane elastomer; a rubber sheet made of a natural rubber or a synthetic rubber such as styrene-butadiene rubber; a metal foil such as an aluminum foil; and the like, and the second invention is not limited only to those exemplified ones. The thickness of the masking film is not particularly limited, and it is preferred that the thickness is usually 10 to 200 μm or so.

The process for covering the surface of the insulating substrate 1 on which the seed layer 3 of the insulating substrate 1 is formed with the masking film 12 includes, for example, a process which includes using a masking film made of a thermoplastic resin as the masking film 12, placing the masking film on the surface of the insulating substrate 1 on which the seed layer 3 is formed, and heating the masking film for temporarily adhering the masking film to the insulating substrate 1, a process which includes using a masking film having an adhesive layer as the masking film 12, superimposing the surface of the masking film on which the adhesive layer is formed on the surface of the insulating substrate 1 on which the seed layer 3 is formed, to temporarily adhere the masking film 4 to the insulating substrate 1, and the like, and the second invention is not limited only to those exemplified ones.

Incidentally, in the embodiment as shown in FIG. 2(e), a space exists between the metal layer 8 and the masking film 12. However, the seed layer 3 can be contacted with the masking film 12 by thinning the resist layer 9 so as not to form the space between the metal layer 8 and the masking film 12.

Next, as shown in FIG. 2(f), electroplating is carried out from the surface of the insulating substrate 1 opposite to the surface of the insulating substrate 1 on which the seed layer 3 is formed, to form a metal layer 13 in the through hole 2.

A process for carrying out electroplating on the surface of the insulating substrate 1 opposite to the surface of the insulating substrate on which the seed layer 3 is formed includes, for example, a process for arranging the insulating substrate 1 and a positive electrode (not shown in the figure) so that the surface of the insulating substrate 1 opposite to the surface of the insulating substrate 1 on which the seed layer 3 is formed is faced to the positive electrode, and carrying out electroplating on the surface of the insulating substrate 1 opposite to the surface on which the seed layer 3 is formed, and the like. When the electroplating is thus carried out on the surface of the insulating substrate 1 opposite to the surface on which the seed layer 3 is formed, a metal precipitates from the seed layer 3 as a starting point, and the metal layer 13 is formed in the space between the masking film 12 and the seed layer 3.

When the metal layer 13 is formed in the through hole 2 by carrying out electroplating from the surface of the insulating substrate 1 opposite to the surface of the insulating substrate 1 on which the seed layer 3 is formed, an electrolysis vessel (not shown in the figure) can be used in the same manner as mentioned above. The insulating substrate 1 and a positive electrode (not shown in the figure) are arranged in an electrolysis vessel so that the surface of the insulating substrate 1 opposite to the surface of the insulating substrate 1 on which the seed layer 3 is formed is faced to the positive electrode, and the electrolysis vessel is charged with a plating solution so that the insulating substrate 1 and the positive electrode are dipped in the plating solution. Thereafter, electroplating can be carried out. At that time, the seed layer 3 of the insulating substrate 1 acts as a negative electrode. In addition, the electroplating also can be carried out after the electrolysis vessel is charged with a plating solution, and then the insulating substrate 1 and the positive electrode are dipped in the plating solution.

The distance between the surface of the insulating substrate 1 opposite to the surface of the insulating substrate 1 on which the seed layer 3 is formed and the positive electrode is not particularly limited, and the distance is preferably 5 to 50 mm or so from the viewpoint that electroplating can be efficiently carried out from the surface of the insulating substrate 1 opposite to the surface of the insulating substrate 1 on which the seed layer 3 is formed.

The plating solution can be appropriately selectively used in accordance with the kind of a metal which is used in the metal layer 13 formed in the through hole 2 of the insulating substrate 1. The metal which is used in the metal layer 13 includes, for example, gold, silver, copper, platinum, aluminum, tin, rhodium, nickel, chromium, cobalt, palladium, tungsten, an alloy made of these metals and the like, and the second invention is not limited only to those exemplified ones. In addition, as a metal which is used in the positive electrode, there can be used a metal corresponding to the kind of the metal which is used in the metal layer 13 formed in the through hole 2 of the insulating substrate 1. The metal which is used in the positive electrode is the same as the metal which is formed in the through hole 2 of the insulating substrate 1. The above-mentioned metal includes, for example, gold, silver, copper, platinum, aluminum, tin, rhodium, nickel, chromium, cobalt, palladium, tungsten, an alloy made of these metals and the like, and the second invention is not limited only to those exemplified ones.

The kind of the plating solution can be selectively used in accordance with the kind of a metal which is used in the metal layer 13 formed in the through hole 2 of the insulating substrate 1 in the same manner as mentioned above. For example, when the metal which is used in the metal layer 13 formed in the through hole 2 of the insulating substrate 1 is copper, there can be used a copper sulfate-containing plating solution which includes copper sulfate and sulfuric acid, and as occasion demands, chloride ion, a plating inhibitor, a plating promoter and the like as the plating solution.

When electroplating is carried out from the surface of the insulating substrate 1 opposite to the surface of the insulating substrate 1 on which the seed layer 3 is formed, the current density is not particularly limited. The current density is preferably 0.5 to 10 A/dm$^2$, more preferably 0.5 to 5 A/dm$^2$ from the viewpoint of efficient formation of a close packed metal layer 13 in the through hole 2 of the insulating substrate 1. In addition, when electroplating is carried out, the liquid temperature of the plating solution is not particularly limited. The liquid temperature is preferably 5 to 80° C., more preferably 10 to 60° C., furthermore preferably room temperature.

The electroplating is thus carried out from the surface of the insulating substrate 1 opposite to the surface of the insulating substrate 1 on which the seed layer 3 is formed to form a metal layer 13 in the through hole 2, and thereby an electrode 10 can be formed.

Subsequently, the masking film 12 formed on the seed layer 3, the resist layer 9 and the seed layer 3 are removed from the insulating substrate 1, to give a wiring board as shown in FIG. 2(*g*).

Incidentally, the seed layer remaining on the insulating substrate 1 can be easily removed from the insulating substrate 1, for example, by chemical reaction with a wet etching technique in which an etchant (etching solution) is used.

The wiring board can be produced by the process as described above. According to the process for producing a wiring board of the second invention, since a void is hardly generated, reliability of a wiring board is significantly improved. Moreover, since the thickness of a metal formed by electroplating on the surface of the seed layer can be reduced, the period of time necessary for plating can be shortened, the amount of a metal which is used in an electrode can be reduced, and a wiring board having an electrode of which surface is smooth can be produced.

In addition, according to the process for producing a wiring board of the second invention, there is no necessity to provide a wiring board with an electrode after the production of a wiring board, which has been conventionally necessitated. Since a metal layer is formed in the through hole of an insulating substrate under the condition such that a masking film is placed on the seed layer, an electrode having a smooth surface can be formed. Therefore, a wiring board having an electrode of which surface is smooth can be efficiently produced.

In addition, according to a conventional process for producing a wiring board, since a process for carrying out electroplating on an insulating substrate without a masking film has been employed, a metal layer grows up from each through hole existing on both surfaces of the insulating substrate to the central portion of the insulating substrate in thickness. Therefore, in accordance with the formation of a metal layer in the through hole, the concentration of a metal contained in a plating solution is gradually lowered, and a current density of the plating solution is gradually lowered. Thereby, not only production efficiency of a wiring board is lowered, but also a void is easily generated in the central portion of the through hole.

To the contrary, according to the process for producing a wiring board of the second invention, when a metal layer is formed in the through hole by carrying out electroplating on the surface of the insulating substrate on which the seed layer is formed, there is employed a process for forming a metal layer in the through hole so that the diameter of the opening of the through hole in which the metal layer is formed is 10 to 50% of the diameter of the opening of the through hole before the formation of the metal layer, and carrying out electroplating from the surface of the insulating substrate opposite to the surface of the insulating substrate on which the seed layer is formed, to form a metal layer in the through hole. Therefore, a void is hardly generated in a metal layer which is formed in a through hole; the thickness of a metal formed on the surface of the seed layer by electroplating can be reduced; the period of time necessary for plating can be shortened; the amount of a metal which is used in a metal layer can be reduced; and a wiring board having an electrode of which surface is smooth can be produced.

Accordingly, there are some advantages in the process for producing a wiring board of the second invention that a wiring board can be efficiently produced as compared with conventional processes for producing a wiring board.

As described above, since a void is hardly generated in a metal layer formed in a through hole of a wiring board which is produced by a process for producing a wiring board of the second invention, the wiring board is excellent in reliability. Therefore, the wiring board is expected to be used, for example, as a wiring board for mounting a semiconductor chip, and the like.

EXAMPLES

Next, the first invention and the second invention will be more specifically described based on working examples. However, the first invention and the second invention will not be limited only to those examples.

The First Invention

Production Example 1

As an insulating substrate, there was used a silicon substrate having a diameter of 150 mm and a thickness of 300 μm, provided with 50 through holes having a hole diameter of 50 μm on a straight line aligned at a regular interval of 500 μm. A titanium layer having a thickness of 50 nm was formed as a seed layer on one surface of the silicon substrate, and then a copper layer having a thickness of 300 nm was formed on the surface by using a load-lock type sputtering apparatus commercially available from ULVAC, Inc. under the model number of CS-200. As shown in FIG. 1(b), a protrusion 3a was formed on the seed layer. The protrusion 3a had a length L of about 20 μm and a thickness D of about 150 nm.

Example I-1

The silicon substrate having a seed layer obtained in Production example 1 was used as a substrate. A masking film (a resin film made of polyethylene having a thickness of 30 μm) was attached to the surface of the silicon substrate on which the seed layer was formed, to cover the surface of the silicon substrate on which the seed layer was formed with the masking film.

Subsequently, an electrolysis vessel 6 having a form as shown in FIG. 1(d) was used. The silicon substrate and a positive electrode made of copper were dipped in a copper sulfate plating solution (concentration of sulfuric acid: 150 g/L, concentration of copper sulfate: 150 g/L, concentration of chlorine: 0.2 mL/L) at 25° C. so that the surface of the silicon substrate opposite to the surface of the masking film-covered silicon substrate on which the seed layer was formed was faced to the positive electrode at an interval of about 25 mm, and copper electroplating was carried out at a current density of 2 A/dm², to form a metal layer in the through hole.

A copper layer was thus formed as a metal layer in the through hole of the silicon substrate, and then the masking film was removed from the silicon substrate, to give a silicon substrate having a seed layer on its surface.

Next, as a resist layer having a pattern for forming an electrode on the surface of the metal layer (pattern having a through hole at the position where an electrode is to be formed), a dry film resist having a thickness of 50 μm was attached to the seed layer so as to form an electrode on the surface of the metal layer (copper layer) of the silicon substrate.

The silicon substrate and a positive electrode made of copper were dipped in a copper sulfate plating solution (concentration of sulfuric acid: 150 g/L, concentration of copper sulfate: 150 g/L, concentration of chlorine: 0.2 mL/L) at 25° C. so that the surface of the silicon substrate on which the seed layer was formed was faced to the positive electrode at an interval of about 25 mm, and electroplating was carried out at a current density of 2 A/dm², to form an electrode (thickness: 25 μm) on the surface of the metal layer of the silicon substrate.

Next, the dry film resist attached to the silicon substrate was peeled off from the silicon substrate, and the seed layer was removed from the silicon substrate by wet-etching, to give a wiring board.

The wiring board obtained in the above was cut, and its cross section was observed by means of a scanning electron microscope. As a result, no void was observed in the metal layer (copper layer) filled in the through hole of the wiring board.

Comparative Example I-1

As an insulating substrate, there was used a silicon substrate having a diameter of 150 mm and a thickness of 350 μm, provided with 50 through holes having a hole diameter of 60 μm on a straight line aligned at a regular interval of 120 μm.

Subsequently, a metal layer (copper layer) having a thickness of about 1 μm was formed on the entire surface of the silicon substrate by electroless plating. A masking film (a resin film made of polyethylene having a thickness of 30 μm) was attached to one surface of the silicon substrate, to cover the surface on which the seed layer was formed with the masking film.

Next, an electrolysis vessel 6 having a form as shown in FIG. 1(d) was used. The silicon substrate and a positive electrode made of copper were dipped in a copper sulfate plating solution (concentration of sulfuric acid: 150 g/L, concentration of copper sulfate: 150 g/L, concentration of chlorine: 0.2 mL/L) in the electrolysis vessel at 25° C. so that the surface of the masking film-covered silicon substrate on which the masking film was not formed (other surface of the silicon substrate) was faced to the positive electrode at an interval of about 25 mm, and copper electroplating was carried out at a current density of 2 A/dm², to form a metal layer (copper layer) on the other surface of the silicon substrate. This metal layer was also formed on the inner wall surface in the vicinity of the opening of the through hole of the silicon substrate, and its protrusion was formed toward the interior of the through hole. The copper electroplating was further continued to close the opening of the through hole of the silicon substrate.

The opening of the through hole on the other surface of the silicon substrate was exposed by peeling off the masking film from the silicon substrate, and a dry film resist was attached to one surface of the silicon substrate on which the through hole was closed.

Next, the seed layer formed in the through hole and on the other surface of the silicon substrate was removed from the silicon substrate by etching, and then the seed layer-removed silicon substrate and a positive electrode were dipped in a copper sulfate plating solution (concentration of sulfuric acid: 150 g/L, concentration of copper sulfate: 150 g/L, concentration of chlorine: 0.2 mL/L) at 25° C., and copper electroplating was carried out at a current density of 2 A/dm², to fill the through hole of the silicon substrate with a metal layer (copper layer).

Subsequently, the other surface of the silicon substrate was polished so that the exposed surface of the metal layer filled in the through hole of the silicon substrate became flat, and then a copper layer having a thickness of 300 nm or so was formed on the other surface of the silicon substrate by using a load lock system sputtering apparatus commercially available from ULVAC, Inc. under the model number of CS-200. The silicon substrate having the formed copper layer and a positive electrode were dipped in a copper sulfate plating solution (concentration of sulfuric acid: 150 g/L, concentration of copper sulfate: 150 g/L, concentration of chlorine: 0.2 mL/L) at 25° C., and copper electroplating was carried out at a current density of 2 A/dm$^2$, to form a metal layer (copper layer) having a thickness of about 3 µm on the surface of the copper layer of the silicon substrate, and thereby a wiring board was obtained.

The wiring board obtained in the above was cut, and its cross section was observed by means of a scanning electron microscope. As a result, a void was observed in the metal layer (copper layer) filled in the through hole of the wiring board.

From the comparison of Example I-1 with Comparative Example I-1, according to Example I-1, it can be seen that a wiring board in which no void is generated can be efficiently produced without the repeat of a complicated metal plating plural times, which is employed in Comparative example I-1.

Therefore, according to the process for producing a wiring board of the first invention, not only a void is hardly generated in the metal layer filled in the through hole, but also a wiring board can be efficiently produced without a process for closing the through hole existing on the seed layer-formed surface with a metal layer.

The Second Invention

Example II-1

As an insulating substrate, there was used a silicon substrate having a diameter of 150 mm and a thickness of 300 µm, provided with 50 through holes having a hole diameter of 50 µm on a straight line aligned at a regular interval of 500 µm. A titanium layer having a thickness of 50 nm was formed as a seed layer on one surface of the silicon substrate, and then a copper layer having a thickness of 300 nm was formed on the surface by using a load-lock type sputtering apparatus commercially available from ULVAC, Inc. under the model number of CS-200, to form a seed layer.

A negative type dry film resist was placed on the formed seed layer, and photolithography patterning was carried out, to form a resist patterning layer having a predetermined pattern on an area of the seed layer where an electrode is not formed. The surface opposite to the surface on which the seed layer was formed was covered with a masking film (a resin film made of polyethylene having a thickness of 30 µm).

The silicon substrate and a positive electrode made of copper were dipped in a copper sulfate plating solution (concentration of sulfuric acid: 150 g/L, concentration of copper sulfate: 150 g/L, concentration of chlorine: 0.2 mL/L) at 25° C. so that the surface of the silicon substrate on which the seed layer was formed was faced to the positive electrode, and copper electroplating was carried out at a current density of 2 A/dm$^2$, to form a metal layer in the through hole so that the diameter of the opening of the through hole in which the metal layer was formed was 20% of the diameter of the opening of the through hole before the formation of the metal layer.

Next, the surface on which the seed layer was formed was covered with a masking film (a resin film made of polyethylene having a thickness of 30 µm), and the masking film which covered the surface opposite to the surface on which the seed layer was formed was removed from the silicon substrate. Thereafter, the silicon substrate and a positive electrode made of copper were dipped in a copper sulfate plating solution (concentration of sulfuric acid: 150 g/L, concentration of copper sulfate: 150 g/L, concentration of chlorine: 0.2 mL/L) at 25° C. so that the surface opposite to the surface on which the seed layer was formed was faced to the positive electrode, and copper electroplating was carried out at a current density of 2 A/dm$^2$, to form a copper layer in the through hole.

Next, the masking film and the resist layer were removed from the silicon substrate, and a chemical reaction was carried out by a wet etching process in which an etchant was used, to give a wiring board.

The inside of the wiring board obtained in the above was examined by means of a micro-focus X-ray inspection apparatus commercially available from TOSHIBA IT & CONTROL SYSTEMS CORPORATION under the product number of TOSMICRON-SH6160IN. The result is shown in FIG. 3. As shown in FIG. 3 which is a photograph showing an image of the wiring board, which was photographed by means of a micro-focus X-ray inspection apparatus, it can be seen that no void is generated in the copper layer formed in the through hole of the wiring board obtained in the above.

Example II-2

A wiring board was obtained in the same manner as in Example II-1 except that the metal layer was formed in the through hole so that the diameter of the opening of the through hole in which metal layer was formed was 20% of the diameter of the opening of the through hole before the formation of the metal layer in Example II-1.

The inside of the wiring board obtained in the above was examined by means of a micro-focus X-ray inspection apparatus commercially available from TOSHIBA IT & CONTROL SYSTEMS CORPORATION under the product number of TOSMICRON-SH6160IN. As a result, it was confirmed that no void was generated in the copper layer formed in the through hole of the wiring board obtained in the above, as well as Example II-1.

Example II-3

A wiring board was obtained in the same manner as in Example II-1 except that the metal layer was formed in the through hole so that the diameter of the opening of the through hole in which metal layer was formed was 45% of the diameter of the opening of the through hole before the formation of the metal layer in Example II-1.

The inside of the wiring board obtained in the above was examined by means of a micro-focus X-ray inspection apparatus commercially available from TOSHIBA IT & CONTROL SYSTEMS CORPORATION under the product number of TOSMICRON-SH6160IN. As a result, it was confirmed that no void was generated in the copper layer formed in the through hole of the wiring board obtained in the above, as well as Example II-1.

Comparative Example II-1

A wiring board was obtained in the same manner as in Example II-1 except that the through hole was closed by forming a metal layer in the through hole so that the diameter of the opening of the through hole in which metal layer was formed was 100% of the diameter of the opening of the through hole before the formation of the metal layer in Example II-1.

The inside of the wiring board obtained in the above was examined by means of a micro-focus X-ray inspection apparatus commercially available from TOSHIBA IT & CONTROL SYSTEMS CORPORATION under the product number of TOSMICRON-SH6160IN. As a result, it was confirmed that a void was generated in the copper layer formed in the through hole of the wiring board obtained in the above.

Comparative Example II-2

A wiring board was obtained in the same manner as in Example II-1 except that it was omitted to carry out copper electroplating so that the surface of the silicon substrate on which the seed layer was formed was faced to the positive electrode made of copper in Example II-1.

The inside of the wiring board obtained in the above was examined by means of a micro-focus X-ray inspection apparatus commercially available from TOSHIBA IT & CONTROL SYSTEMS CORPORATION under the product number of TOSMICRON-SH6160IN. As a result, it was confirmed that a void was generated in the copper layer formed in the through hole of the wiring board obtained in the above.

Comparative Example II-3

As an insulating substrate, there was used a silicon substrate having a diameter of 150 mm and a thickness of 350 µm, provided with 50 through holes having a hole diameter of 60 µm on a straight line aligned at a regular interval of 120 µm. A titanium layer having a thickness of 50 nm was formed as a seed layer on one surface of the silicon substrate, and then a copper layer having a thickness of 300 nm was formed on the surface by using a load-lock type sputtering apparatus commercially available from ULVAC, Inc. under the model number of CS-200.

Next, the silicon substrate having a copper layer obtained in the above and a positive electrode made of copper were dipped in a copper sulfate plating solution (concentration of sulfuric acid: 150 g/L, concentration of copper sulfate: 150 g/L, concentration of chlorine: 0.2 mL/L) at 25° C. so that the silicon substrate having the copper layer obtained in the above was faced to the positive electrode, and copper electroplating was carried out at a current density of 2 A/dm$^2$, to form a copper layer in the through hole, and thereby a wiring board was obtained.

The wiring board obtained in the above was cut, and the cross section was observed in the same manner as in Example II-1 by means of a scanning electron microscope. As a result, it was confirmed that many voids were generated in the copper layer formed in the through hole of the wiring board obtained in the above.

From the above results, it can be seen that according to the process for producing a wiring board of the second invention, it is possible to produce a wiring board in which a void is hardly generated in the metal layer which is formed in the through hole.

INDUSTRIAL APPLICABILITY

According to the process for producing a wiring board of the present invention, since a wiring board in which no void is generated in the metal layer which is filled in the through hole can be efficiently produced, the process for producing a wiring board of the present invention is a useful process, for example, in production of a wiring board which is used for mounting a semiconductor chip and the like.

EXPLANATION OF REFERENTIAL NUMBERS 1 insulating substrate
2 through hole
3 seed layer
4 masking film
5 positive electrode
6 electrolysis vessel
7 plating solution
8 metal layer
8a surface of a metal layer
9 resist layer
10 electrode
11 through hole
12 masking film
13 metal layer

The invention claimed is:

1. A process for producing a wiring board using an insulating substrate having a through hole, comprising:
   forming a seed layer on one surface of an insulating substrate,
   forming a resist layer on an area of the seed layer where an electrode is not formed, and covering the whole surface of the insulating substrate opposite to the surface of the insulating substrate on which the seed layer is formed with a first masking film,
   carrying out electroplating on the surface of the insulating substrate on which the seed layer is formed to form a metal layer in the through hole so that the diameter of an opening of the through hole in which the metal layer is formed is 10 to 50% of the diameter of the opening of the through hole before formation of the metal layer,
   covering the whole surface of the insulating substrate on which the seed layer is formed with a second masking film, and removing the first masking film which covers the surface of the insulating substrate opposite to the surface of the insulating substrate on which the seed layer is formed,
   carrying out electroplating from the surface of the insulating substrate opposite to the surface of the insulating substrate on which the seed layer is formed, to form a metal layer in a space between the second masking film and the insulating substrate, and the through hole, and thereby an electrode is formed, and
   removing the second masking film formed on the seed layer, the resist layer and the seed layer from the insulating substrate.

2. The process according to claim 1, wherein during the seed forming step, a protrusion of the seed layer is formed on an inner surface of the through hole.

3. The process according to claim 2, wherein the protrusion has a length of 10 nm to 50 µm and a thickness of 3 nm to 500 nm.

* * * * *